United States Patent
Cho

(10) Patent No.: US 9,709,606 B1
(45) Date of Patent: Jul. 18, 2017

(54) SMART VOLTMETER FOR ELECTRIC FENCE

(71) Applicant: Byung-Hak Cho, Daejeon (KR)

(72) Inventor: Byung-Hak Cho, Daejeon (KR)

(73) Assignee: Byung-Hak Cho, Daejeon (KR)

( * ) Notice: Subject to any disclaimer, the term of this patent is extended or adjusted under 35 U.S.C. 154(b) by 0 days.

(21) Appl. No.: 15/247,963

(22) Filed: Aug. 26, 2016

(30) Foreign Application Priority Data

May 25, 2016 (KR) .................. 10-2016-0063805

(51) Int. Cl.
G08B 13/00 (2006.01)
G01R 19/04 (2006.01)
G01R 13/00 (2006.01)

(52) U.S. Cl.
CPC .............. *G01R 19/04* (2013.01); *G01R 13/00* (2013.01)

(58) Field of Classification Search
CPC .......... G08B 13/122; G01R 1/06; H05C 1/04; H05C 3/00; A01K 3/00
See application file for complete search history.

(56) References Cited

U.S. PATENT DOCUMENTS

| | | | |
|---|---|---|---|
| 2,450,153 A | 9/1948 | Moore | |
| 3,883,804 A * | 5/1975 | Wilson | G01R 19/145 174/59 |
| 4,220,949 A * | 9/1980 | Pope | G08B 13/122 256/10 |
| 4,523,187 A * | 6/1985 | Begg | G01R 19/16585 256/10 |
| 4,725,825 A * | 2/1988 | McKean | G08B 5/36 256/10 |
| 4,771,245 A * | 9/1988 | Woodhead | G01R 27/20 324/510 |
| 5,302,945 A * | 4/1994 | Stoltenberg | A01K 3/005 256/10 |
| 5,596,281 A * | 1/1997 | Eriksson | H05C 3/00 324/678 |
| 5,771,147 A * | 6/1998 | Eriksson | G01R 27/205 256/10 |
| 8,278,963 B2 | 10/2012 | Rabjohn | |
| 2008/0186172 A1* | 8/2008 | Thompson | H05C 3/00 340/541 |

FOREIGN PATENT DOCUMENTS

| | | | |
|---|---|---|---|
| AU | 9953631 A | * | 4/2000 |
| JP | 2005030770 A | * | 2/2005 |

* cited by examiner

*Primary Examiner* — Jermele M Hollington

(57) ABSTRACT

The present disclosure provides an electric fence voltmeter having a peak detection type voltage divider. The peak detection type voltage divider has an extremely simple configuration composed of two capacitor voltage dividers and two rectifier diodes for detecting the positive and the negative peak voltages of a high voltage pulse with an additional pulse state voltage having information on the moments the high voltage pulse starts and peaks. Thus, the voltmeter has reduced number of parts with simplified circuits, and is able to measure the peak voltage accurately with a reliable and efficient manner using the pulse state voltage. Thereby the voltmeter has benefits of improved measurement accuracy, reduced production cost, and low battery consumption.

11 Claims, 7 Drawing Sheets

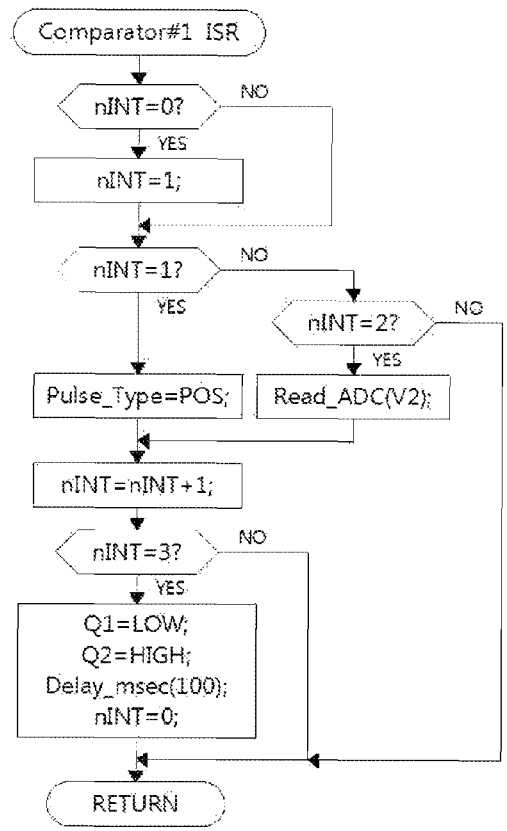

Start Comparator #1 Int. Service Routine

Is it new sequence?
YES : New, Assign 1st interrupt number
NO : Ongoing (including Comparator #2 ISR)

Verify interrupt number & Do measurement
1st interrupt : recognize positive peak pulse
2nd interrupt : read 1st detector voltage V2
             through 1st A/D channel
N/A : irrelevant to Comparator #1 ISR

Increase interrupt number

Verify interrupt number & Close sequence
YES : close sequence if interrupt number is 3
 - reset comparator output state (Q1, Q2)
 - wait 100msec for oscillation settle down
 - reset interrupt number
NO : continue measuring sequence

Return from Comparator #1 ISR

FIG. 6A

Start Comparator #2 Int. Service Routine

Is it new sequence?
YES : New, Assign 3rd interrupt number
NO : Ongoing (including Comparator #1 ISR)

Verify interrupt number & Do measurement
3rd interrupt : recognize negative peak pulse
4th interrupt : read 2nd detector voltage V3
 through 2nd A/D channel
N/A : irrelevant to Comparator #2 ISR

Increase interrupt number

Verify interrupt number & Close sequence
YES : close sequence if interrupt number is 5
 - reset comparator output state (Q1, Q2)
 - wait 100msec for oscillation settle down
 - reset interrupt number
NO : continue measuring sequence

Return from Comparator #2 ISR

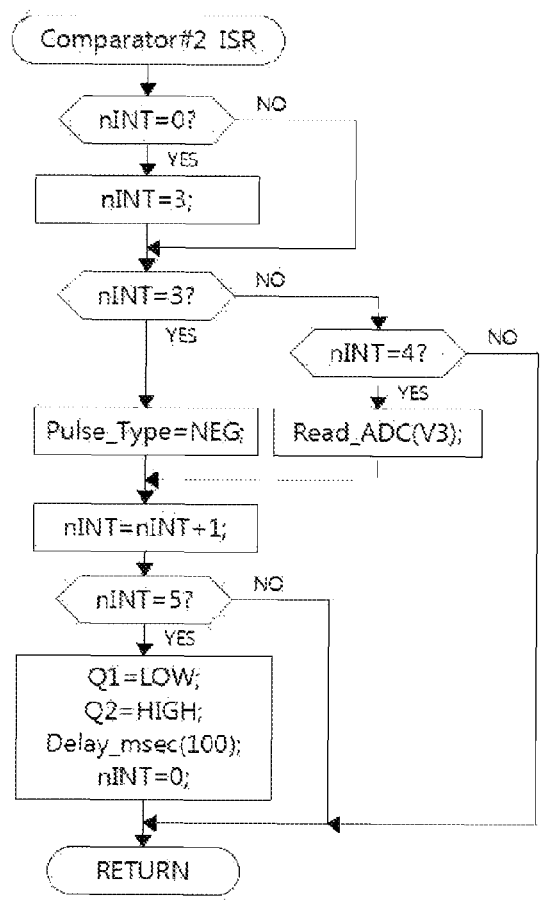

FIG. 6B

SMART VOLTMETER FOR ELECTRIC FENCE

BACKGROUND OF THE INVENTION

Field of the Invention

The present disclosure relates to a voltmeter for measuring the peak voltage of a high voltage pulse applied to an electric fence. More particularly, the present disclosure relates to an electric fence voltmeter having a peak detection type voltage divider that provides positive and negative peak voltages with an additional pulse state voltage. The voltmeter is extremely simple in configuration, but is able to measure the peak voltage accurately in a reliable and efficient manner using the pulse state voltage that has information on the moments the high voltage pulse starts and peaks.

Related Art

An electric fence prevents the intrusion of wild animals, or the escape of livestock cultivated in the fence. A pulse shaped high voltage generated from an energizer is applied between the ground (earth) and the fence wire which is supported by the insulators installed around fence posts. If an animal is in contact with the fence wire, a strong pain is caused by an electric shock due to the circulating current flowing through the animal.

Most of the electric fence energizer has a transformer that has more turns on the secondary winding than the primary to induce a high voltage pulse having a peak value of 2 kV to 10 kV. The high voltage pulse is induced from the secondary winding of the transformer when the electric charge stored in an energy storage capacitor is discharged through the primary winding. The reason for raising the fence voltage up to 10 kV is to breakdown the electrical insulating effect that the animal hairs have.

The period of applying high voltage pulses to the electric fence wire is usually 0.75 to 1.5 seconds, and the pulse duration is 5 to 500 microseconds. The high voltage pulses have normally positive polarity relative to the ground, but may also have a negative polarity.

Sometimes, the electric fence experiences unwanted low voltage on the fence wire due to the various reasons including the failure of the electric fence energizer itself, the fence wire in contact with trees or weeds, the broken or sagging fence wire on the ground, and the broken insulators.

Once the fence voltage is lowered, the current flowing through the animal becomes weak or may not flow at all. Thus, in order to maintain the electric fence effectively, the voltage applied to the fence wire must be measured frequently by using an adequate voltmeter to ensure that a predetermined high voltage is applied.

In U.S. Pat. No. 2,450,153 A, issued to S. A. Moore, on Sep. 28, 1948, the patent discloses a voltage indicator for electric fences. In the voltage indicator, the fence voltage to be tested is applied to a plurality of resistors which are connected in series to form a voltage dividers, and each resistor has a neon bulb connected in parallel. Consequently, by properly choosing the resistances, it is possible to light a plurality of bulbs selectively corresponding to the strength of the test voltage. This type of device indicates the voltage very roughly, but it is still used when the exact voltage reading is not important.

Detailed discussion on recent technologies is provided in "The design of an electric fence fault finder", M. Sc. Thesis, Massey University New Zealand by Glen McGillan (2009), pp 37-98. The article describes a detailed design of the modern peak voltage detecting circuits. The voltage measuring circuits are based on a resistor voltage divider of which the output is fed to the separated two peak detector circuits to provide the peak voltages of both positive and negative pulses. The peak voltages are read by A/D (analog to digital) conversion channels of an MCU (micro controller unit) and displayed on a display unit.

Most of known modern electric fence voltmeters are concerned that they have too complicated configuration including buffers, inverting amplifiers, and peak detectors, so on. Besides, they also have a problem with determining the time that the pulse reaches its peak.

For the foregoing reasons, there is a need for a simple cost-effective electric fence voltmeter that measures accurately, while draws less power from a battery.

SUMMARY OF THE INVENTION AND ADVANTAGES

In order to meet the needs described above, the electric fence voltmeter, in a generic aspect of the disclosure, may include:

a peak detection type voltage divider 10 which divides the high voltage pulse applied to the probe 11 into a divided voltage and detects the peak of the divided voltage at the same time; an A/D conversion channel 22 for converting the peak of the divided voltage into a digital value; a display unit 30 for displaying the digital value; a control unit 21 for controlling the display unit 30, and reading the peak detection type voltage divider; and a comparator 23 connected between the peak detection type voltage divider 10 and the control unit 21 for notifying the moments the high voltage pulse starts and peaks to the control unit 21.

More specifically, the peak detection type voltage divider 10 may have a capacitor voltage divider composed of a high voltage side capacitor C1 and a low voltage side capacitor C2.

In the capacitive voltage divider, the peak voltage may be held at the low voltage side capacitor C2 by placing a rectifier diode D1 between the high voltage side capacitor C1 and the low voltage side capacitor C2.

In order to provide a signal that indicates the start and peak moments of the high voltage pulse, the voltage Vs that appears at the second electrode C1$b$ of the high voltage side capacitor C1 may be utilized.

Owing to the pulse state voltage Vs, the voltmeter has an advantage of measuring the peak voltage accurately in an efficient manner.

In addition, the voltmeter eliminates the need for separate elements such as a buffer, an inverting amplifier and a peak detector, thereby having an advantage of reducing a production cost and drawing less power from a battery.

BRIEF DESCRIPTION OF THE DRAWINGS

FIG. 6A is a flow chart of the interrupt service routine program initiated by the first comparator.

FIG. 6B is a flow chart of the interrupt service routine program initiated by the second comparator.

DETAILED DESCRIPTION OF THE INVENTION

The present disclosure may be understood more readily by reference to the following detailed description of embodiments and the accompanying drawings. However, the present disclosure may be embodied in many different forms, and should not be construed as being limited to the embodiments set forth herein. Rather, these embodiments are provided so that this disclosure will be thorough and complete and will fully convey the concept of the invention to those skilled in the art, and the present disclosure will only be defined by the appended claims.

The terminology used herein is defined in consideration of the function of corresponding elements used in the present disclosure and may be varied according to users, operator's intention, or practices. In addition, an arbitrarily defined terminology may be used in a specific case and will be described in detail in a corresponding description paragraph. Therefore, the terminology used herein is for the purpose of describing particular embodiments only and is not intended to be limiting of the invention.

Figure 1:
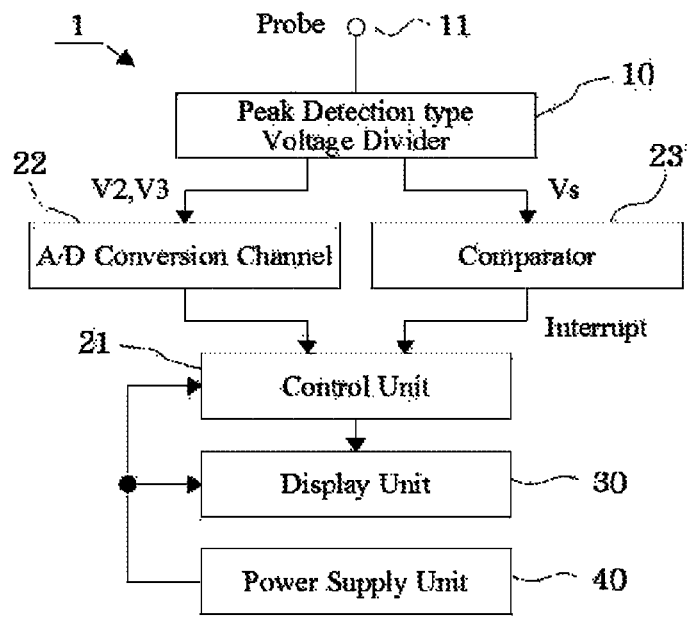
FIG. 1 is a block diagram of the electric fence voltmeter according to the present disclosure.

FIG. 1 shows a generic configuration of the electric fence voltmeter 1 according to the present disclosure. The peak detection type voltage divider 10 provides a positive peak voltage V2 and a negative peak voltage V3. Hereinafter the voltages V2 and V3 will be referred to as a first and a second divided peak voltages, respectively.

In addition, the peak detection type voltage divider 10 provides a pulse state voltage Vs having information on the moments the high voltage pulse starts and peaks. Owing to the pulse state voltage Vs, the control unit 21 is able to measure the divided peak voltages V2 and V3 accurately in an efficient way with the comparator 23 and the A/D conversion channel 22.

The measured peak voltage is displayed on the display unit 30.

A power supply unit 40 is provided to supply necessary electric power to the elements constituting the voltmeter 1.

Now, the embodiments of the present disclosure will be described in detail.

In the first embodiment, an electric fence voltmeter 1A capable of measuring only the peak voltage having a positive polarity is provided.

Figure 2A:
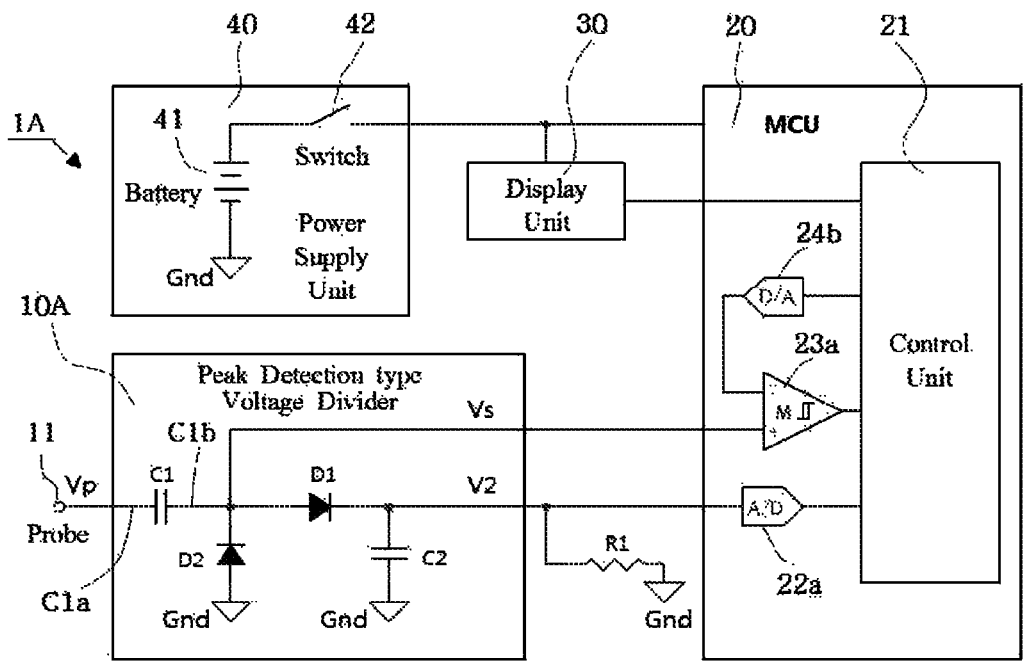
FIG. 2A is a schematic circuit diagram of the electric fence voltmeter according to the first embodiment of the present disclosure.

Referring to FIG. 2A, in the first embodiment, the electric fence voltmeter 1A includes:

a peak detection type voltage divider 10A including:

a first voltage divider composed of a capacitor C1 of which the first electrode C1a is connected to a probe 11 to which a high voltage pulse is applied and a capacitor C2 of which one electrode is connected to a ground Gnd;

a first rectifier diode D1 of which the anode is connected to the second electrode C1b of the capacitor C1, and the cathode is connected to the other electrode of the capacitor C2; and a second rectifier diode D2 of which the cathode is connected to the second electrode C1b of the capacitor C1, and the anode is connected to the ground Gnd, whereby a first divided peak voltage V2 is detected across the capacitor C2, and a pulse state voltage Vs is detected at the second electrode C1b of the capacitor C1;

a first A/D conversion channel 22a for converting the first divided peak voltage V2 into a digital value;

a display unit 30 for displaying the digital value; and a control unit 21 for controlling the display unit 30, and reading the peak detection type voltage divider.

The information contained in the pulse state voltage Vs is utilized for assisting the control unit 21 during the measurement of a peak voltage, and the information is displayed with the measured peak voltage on the display unit 30.

The voltmeter 1A may further include:

a first bias resistor R1 connected to the capacitor C2 in parallel; and a first comparator 23a connected between the second electrode C1b of the capacitor C1 and the control unit 21.

Figure 3:
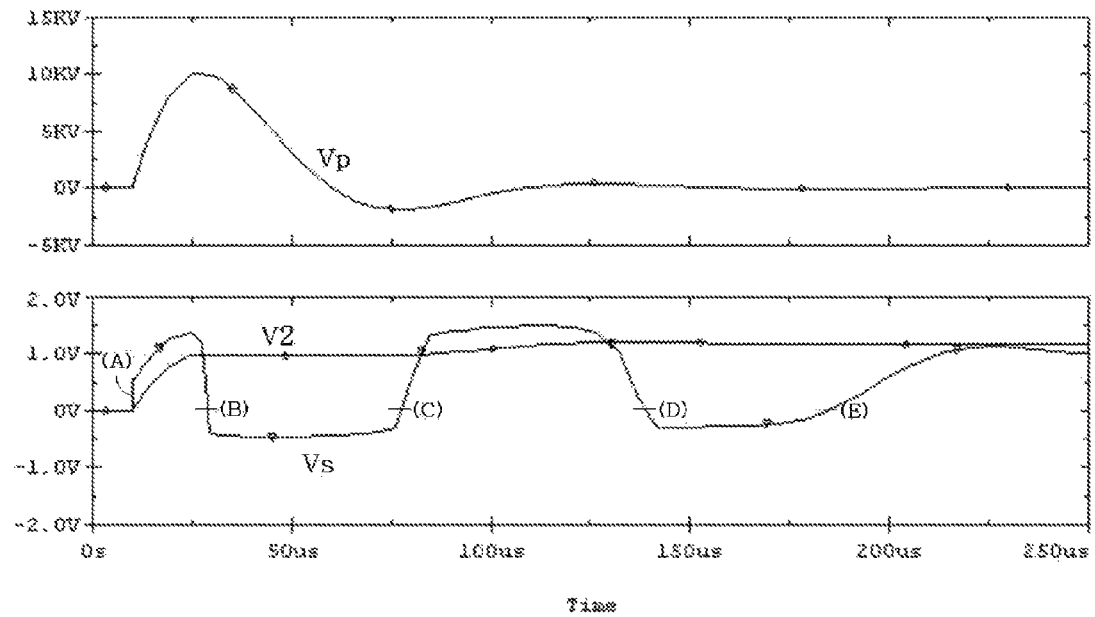
FIG. 3 is a graph showing the response of a peak detection type voltage divider according to the first embodiment of the present disclosure when a high voltage pulse having a positive peak is applied.

The computer simulation of the divided peak voltage V2 and the pulse state voltage Vs are shown in FIG. 3, when an input voltage Vp having plus 10 kV peak is applied to the peak detection type voltage divider 10A. It can be seen that the first divided peak voltage V2 rises until the input voltage Vp reaches the peak (positive peak), then holds the state as the input voltage Vp falls.

Figure 2B:
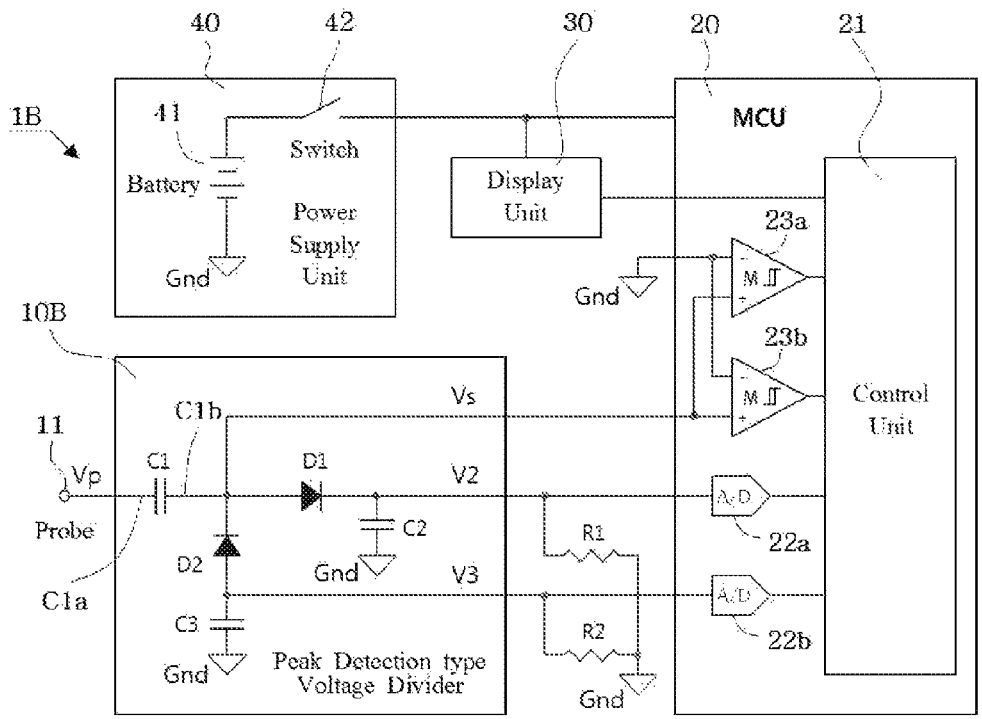
FIG. 2B is a schematic circuit diagram of the electric fence voltmeter according to the second embodiment of the present disclosure.

Referring to FIGS. 2A and 2B, it can be seen that the first embodiment is configured as a part of the second embodiment. Besides, the elements having the same reference numerals also have the same functions. In this reason, the detailed description of the first embodiment will be included in the description of the second embodiment described below.

In the second embodiment, an electric fence voltmeter 1B capable of measuring the peak voltages regardless of the polarity is provided.

Referring to FIG. 2B, in the second embodiment, the electric fence voltmeter 1B further includes:

a second voltage divider composed of the capacitor C1, and a capacitor C3 of which one electrode is connected to the anode of the second diode D2 and the other electrode is connected to the ground Gnd, whereby a second divided peak voltage V3 is detected across the capacitor C3; and a second A/D conversion channel 22b for converting the second divided peak voltage V3 into a digital value, on the electric fence voltmeter 1A.

The voltmeter 1B may further include:

a second bias resistor R2 connected to the capacitor C3 in parallel; and a second comparator 23b connected between the second electrode C1b of the capacitor C1 and the control unit 21.

The comparators 23a and 23b analyze the information contained in the pulse state voltage Vs to provide signals indicating the moments the high voltage pulse starts and peaks to the control unit 21 in an interrupt mode.

Thus, the controller 21 is able to read the divided peak voltage at the peak of the pulse without need to determine whether the peak is reached. Accordingly, the computing program of the MCU 20 can be simplified, and the measurement error can also be reduced.

Referring to FIG. 2B again, when a high voltage having positive polarity is applied between the probe 11 and the ground Gnd, a circulating current flows through the capacitor C1 for charging the capacitor C2 via the first rectifier diode D1. This current flows until the voltage applied to the probe 11 reaches the positive peak. After that, the first rectifier diode D1 is blocked as the probe voltage falls, thereby the capacitor C2 keeps its voltage potential unchanged.

At this time, the capacitors C1 and C2 are charged with the same amount of electric charge (Q). Thus, the capacitors C1 and C2 have the voltage potential of V1=Q/C1, and V2=Q/C2. In the formula, C1 and C2 represent the capacitances of the capacitors C1 and C2, respectively.

The voltage division ratio Rd is expressed as the divided peak voltage V2 divided by the input voltage Vp. In other words, the voltage division ratio Rd is V2/Vp, or if we ignore the forward voltage drop of a diode (about 0.6V, very small compared to Vp) that appears across the first rectifier diode D1, the voltage division ratio Rd becomes V2/(V1+V2). The voltage division ratio Rd can be expressed with the capacitance of the capacitors C1 and C2, as shown in equation (1).

$$Rd = \frac{C1}{C1 + C2} \qquad (1)$$

In contrast, when an input voltage Vp having negative polarity is applied, a circulating current flows through the capacitor C1 and the second rectifier diode D2 for charging the capacitor C3. At this time, the capacitor C3 is charged to have negative potential with the voltage division ratio of C1/(C1+C3). Therefore, in order to make the voltage division ratio identical, regardless of the polarity of a pulse, the capacitance of the capacitor C2 and that of the capacitor C3 must be same.

Figure 4A:
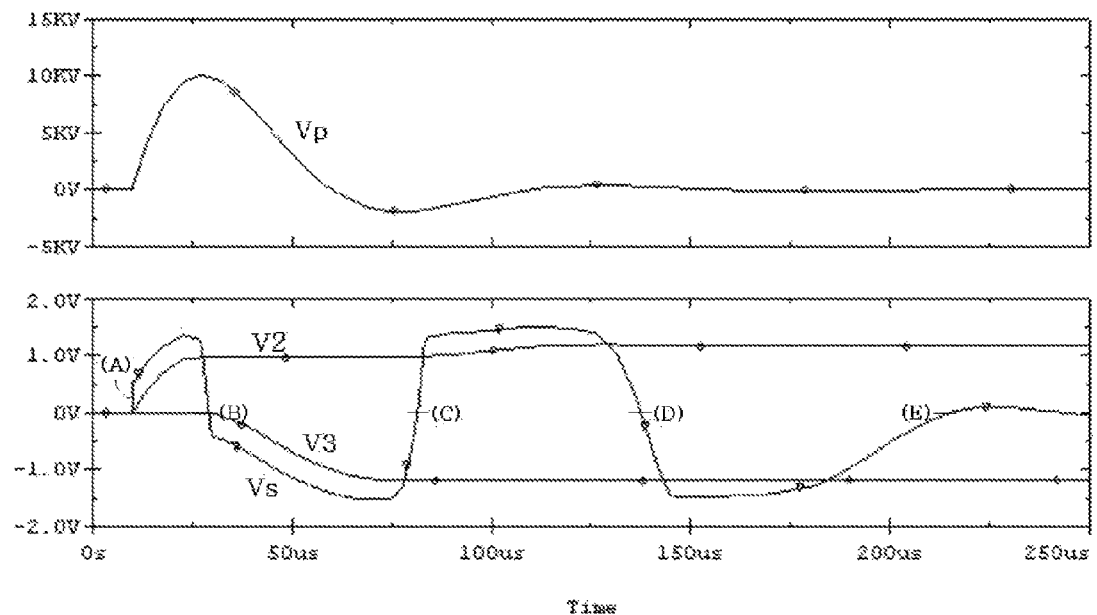
FIG. 4A is a graph showing the response of a peak detection type voltage divider according to the second embodiment of the present disclosure when a high voltage pulse having a positive peak is applied.

The computer simulation of the divided peak voltages V2 and V3 with the pulse state voltage Vs are shown in FIG. 4A, when an input voltage Vp having plus 10 kV peak is applied to the peak detection type voltage divider 10B. The first divided peak voltage V2 rises until the input voltage Vp reaches the peak (positive peak), then holds its voltage potential as the input voltage Vp falls. It can be seen that the rise of the first divided peak voltage V2 is identical to the value obtained by multiplying the peak voltage (10 kV) and the voltage division ratio Rd (1/10,000), that is, 10 kV·1/10,000=1V. The second divided peak voltage V3 measured at the time point (C) in FIG. 4A corresponds to the peak-to-peak voltage of the pulse if it is inversed.

Figure 4B:
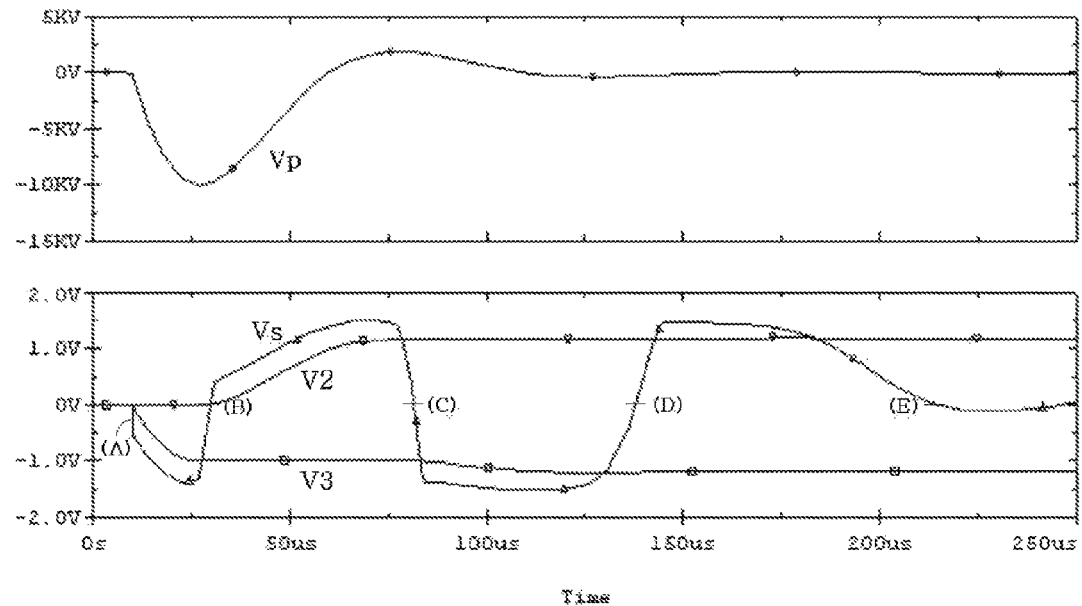
FIG. 4B is a graph showing the response of a peak detection type voltage divider according to the second embodiment of the present disclosure when a high voltage pulse having a negative peak is applied.

FIG. 4B shows the divided peak voltages V2 and V3 with the pulse state voltage Vs as the responses to an input voltage Vp having minus 10 kV peak. It can be readily seen that the behavior of the second divided peak voltage V3 is completely opposite to that of the first divided peak voltage V2 shown in FIG. 4A. That is, the second divided peak voltage V3 falls until the input voltage Vp reaches the negative peak (lowermost point), then holds its voltage potential as the input voltage Vp rises. As expected, the fall of the second divided peak voltage V3 is identical to the value −1V obtained by multiplying the voltage division ratio Rd and the peak of the input voltage Vp. The first divided peak voltage V2 corresponds to the peak-to-peak voltage of the pulse if it is measured at the time point (C) in FIG. 4B.

The divided peak voltages V2 and V3 are affected by the consecutive residual pulses as shown in the interval between (C) and (D) of FIGS. 4A and 4B. Thus, it is desirable to read the divided peak voltages at the time points (B) in FIGS. 4A and 4B. In this disclosure, the pulse state voltage Vs provides information indicating the moments the high voltage pulse starts and peaks so that the control unit 21 is able to measure the divided peak voltage instantly after the peak is reached.

As shown in FIG. 4B, the second divided peak voltage V3 of the peak detection type voltage divider 10B has a negative potential. Thus, it is impossible to input the second divided peak voltage V3 directly into an A/D converter having a positive potential input range only.

As a solution, in the third embodiment of the present disclosure, a bias voltage Vb is applied to the capacitor C3 via a bias resistor. In this way, the second divided peak voltage V3 having the negative potential is shifted to have a positive potential to meet the input range of the A/D conversion channel.

Figure 2C:
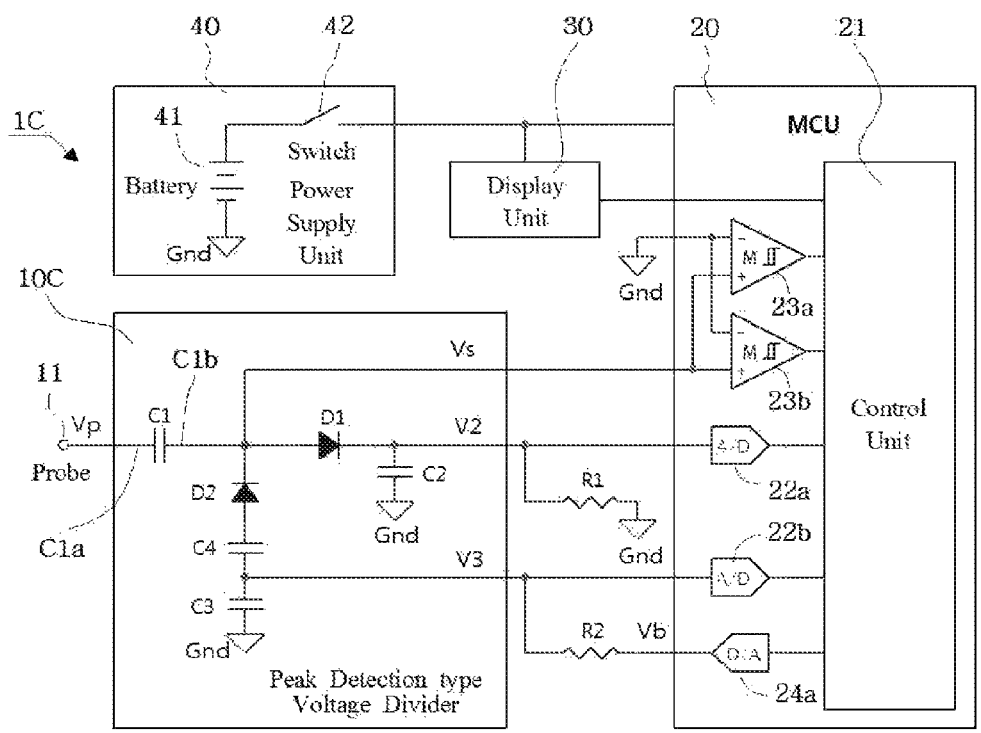
FIG. 2C is a schematic circuit diagram of the electric fence voltmeter according to the third embodiment of the present disclosure.

Referring to FIG. 2C, in the third embodiment, the electric fence voltmeter 1C further includes:

a second bias resistor R2 of which one end is connected to the capacitor C3;

a first D/A converter 24a of which the output is connected to the other end of the second bias resistor R2 for supplying the bias voltage Vb; and a coupling capacitor C4 connected between the second rectifier diode D2 and the capacitor C3 for blocking a current flowing through the second rectifier diode D2 by the bias voltage Vb, on the electric fence voltmeter 1B.

The first D/A converter 24a is set to output the bias voltage Vb of which the voltage potential is identical to that of the reference voltage (ADC reference voltage) of the A/D conversion channels 22a and 22b. In the embodiments of the present disclosure, the reference voltage is chosen to be 2.048V.

The coupling capacitor C4 will have negligibly small influence on the voltage division ratio Rd, if the capacitance of the coupling capacitor C4 is chosen to be over two times greater than that of the capacitor C3.

As previously mentioned, the capacitor C2 is biased to 0V via the first bias resistor R1 connected to the capacitor C2 in parallel. Accordingly, the capacitors C2 and C3 are biased to 0V and the bias voltage Vb, respectively. Thus, the divided peak voltages V2 and V3 are returned to 0V and the bias voltage Vb, respectively, in a predetermined period of time, after they are disturbed by the peak voltages detected. Note that the bias resistors R1 and R2 have the high resistance value of about 10 MΩ.

Figure 5A:
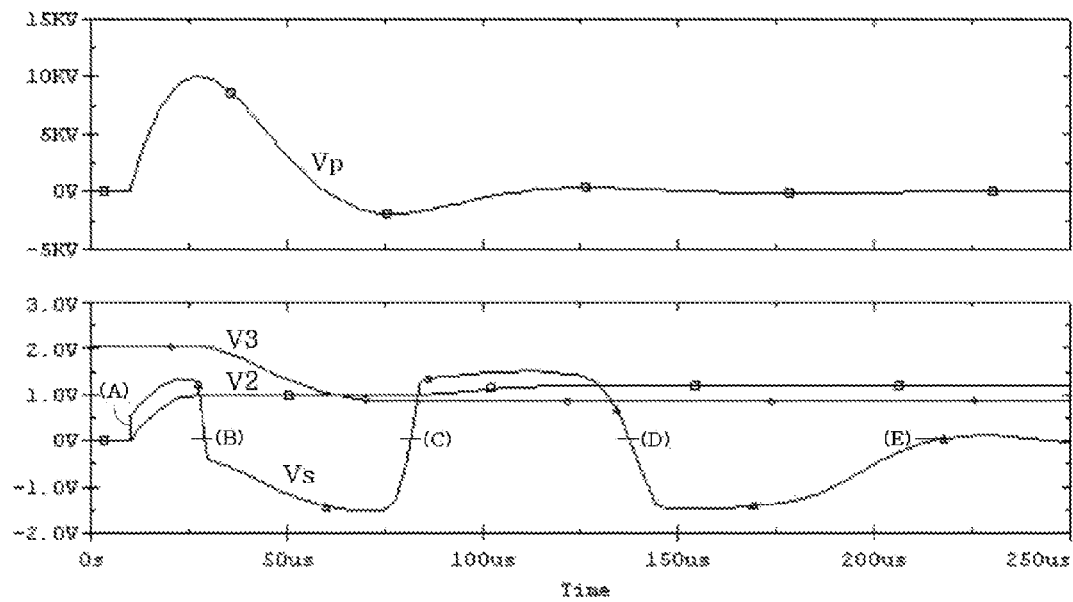
FIG. 5A is a graph showing the response of a peak detection type voltage divider according to the third embodiment of the present disclosure when a high voltage pulse having a positive peak is applied.

FIG. 5A shows the response of the peak detection type voltage divider 10C when a high voltage pulse having plus 10 kV peak is applied. It can be seen that the first divided peak voltage V2 is distributed in the positive potential range upward from 0V.

Figure 5B:
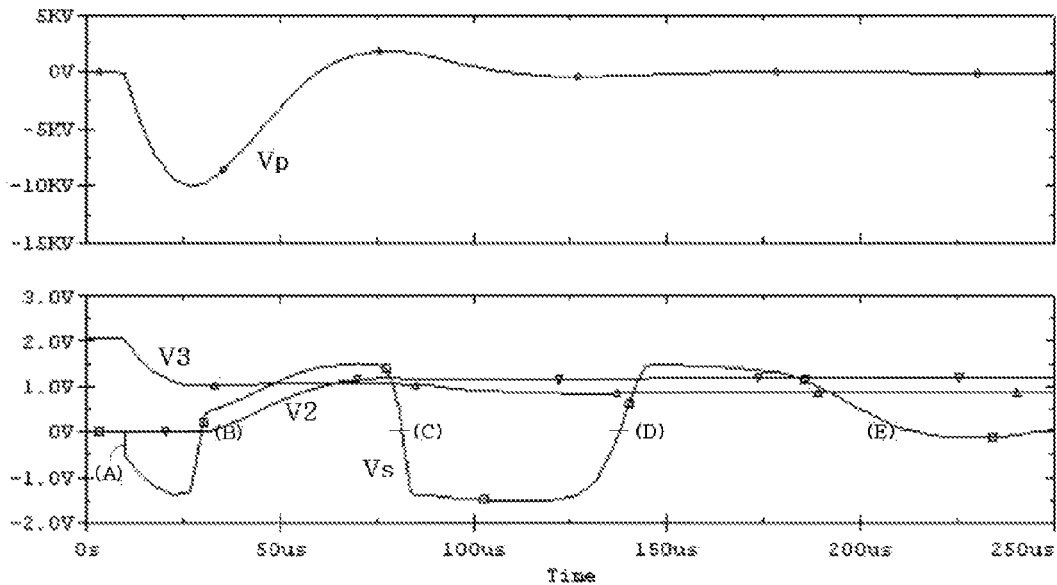
FIG. 5B is a graph showing the response of a peak detection type voltage divider according to the third embodiment of the present disclosure when a high voltage pulse having a negative peak is applied.

FIG. 5B shows the response of the peak detection type voltage divider 10C, when a high voltage pulse having minus 10 kV peak is applied. It can be seen that the second divided peak voltage V3 is distributed in the positive potential range downward relative to 2.048V which is the potential of the bias voltage Vb.

Consequently, it can be observed from the FIGS. 5A and 5B that the behaviors of the divided peak voltages V2 and V3 are distributed within the measuring range (0V~2.048V) of the A/D conversion channels, as intended. The actual measurement of the biased voltage can be calculated by the equation (2) shown below.

$$Vact = Cf(Vadc - Vbias) \qquad (2)$$

In equation (2), Vact is an actual voltage, Vadc is the A/D conversion value of the voltage to be measured, Vbias represents the A/D conversion value of the bias voltage Vb. Conversion ratio Cf is obtained by multiplying the A/D reference voltage Vref and the resolution of the A/D conversion channel. In the embodiments of the present disclosure, the Vref is 2.048V and the resolution is 1/1,024, thus the conversion ratio Cf becomes 0.002.

Figure 5C:
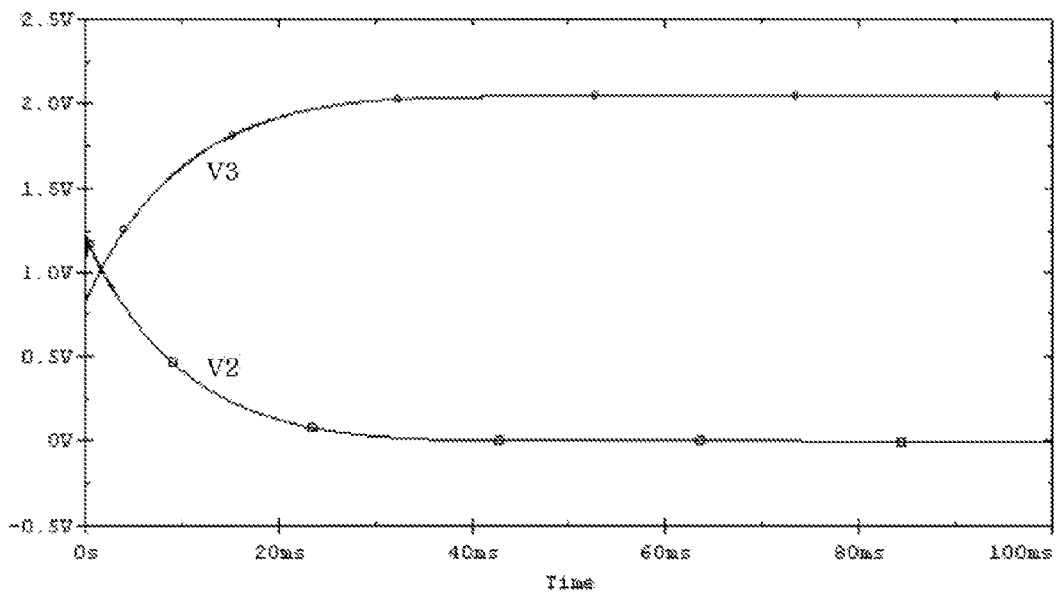
FIG. 5C is a graph showing how the divided peak voltages are returning to the potential of the bias voltages.

FIG. 5C shows the returning process of the divided peak voltages V2 and V3 to their bias voltages after experiencing the detection of a peak voltage. It can be seen that the first divided peak voltage V2 is returned to 0V, and the second divided peak voltage V3 is returned to its bias voltage Vb of 2.048V, in about 50 milliseconds.

From now on, the pulse state voltage Vs which provides information about the high voltage pulse is described.

Referring to FIGS. 3, 4A and 5A, the pulse state voltage Vs rises abruptly ((A) in FIGS. 3, 4A and 5A) by a voltage corresponding to the forward voltage drop (about 0.6V) of the first rectifier diode D1 immediately after the input voltage Vp starts to rise. Similarly, it can also be seen from FIGS. 4B and 5B that the pulse state voltage Vs falls abruptly ((A) in FIGS. 4B and 5B) immediately after the input voltage Vp starts to fall.

In addition, the pulse state voltage Vs changes its sign at the every single peak of the input voltage Vp ((B)-(E) in FIGS. 3-5). This is because the current flowing through the capacitor C1 is proportional to the time derivative of the input voltage Vp. Such a discontinuous nature of the pulse state voltage Vs can be utilized for indicating the occurrence of the high voltage pulse, the polarity of the pulse, and the time that the pulse reaches its peak.

In connection with the pulse state voltage Vs, the measuring sequence of the electric fence voltmeter 1B and 1C is described with the role of the comparators 23a and 23b.

The second and the third embodiments of the present disclosure are to measure the high voltage pulses regardless of the polarity. Thus, it is necessary to detect the polarity of a pulse at the first step of a measuring sequence. In this reason, the reference voltages of the comparators 23a and 23b are set variably depending on the situation.

The reference voltage of a comparator is determined by the threshold voltage of the comparator having hysteresis characteristics. In the embodiments of the present disclosure, the threshold voltage of 65 mV is applied to the comparator when the output state of the comparator is low, and −65 mV is applied when the output state of the comparator is high. In other words, the comparator changes its output state if the pulse state voltage Vs is greater than 65 mV when the output state is low, or if the pulse state voltage Vs is lower than −65 mV when the output state is high.

For the first comparator 23a, the non-inverting input (+), the inverting input (−) and the output are connected to the pulse state voltage Vs, ground Gnd, and the control unit 21, respectively. And, its output state (Q1) is set to low as an initial condition for the measuring sequence.

In this condition, if the pulse state voltage Vs rises in excess of the reference voltage ((A) in FIGS. 3, 4A and 5A), the first comparator 23a changes its output state (Q1) to high. This state transition initiates a first interrupt to notify the control unit 21 that a high voltage pulse having positive peak has been started. Then, if the pulse state voltage Vs falls below the reference voltage ((B) in FIGS. 3, 4A and 5A), the comparator 23a changes its output state (Q1) to low. And, this state transition initiates a second interrupt to notify the control unit 21 that the high voltage pulse has reached its positive peak.

At this time, since the first comparator 23a is set to low state as the initial condition, it responses only to the high voltage pulse having positive peak to initiate the first interrupt. In this way, the control unit 21 recognizes the occurrence of a high voltage pulse having positive peak, in the first interrupt. In the second interrupt, the control unit 21 converts the first divided peak voltage V2 through the first A/D conversion channel 22a into a digital value to measure the positive peak voltage.

On the other hand, the second comparator 23b is connected in the same way as the first comparator 23a. But, its output state (Q2) is set to high as an initial condition for the measuring sequence.

In this condition, if the pulse state voltage Vs falls below the reference voltage ((A) in FIGS. 4B and 5B), the second comparator 23b changes its output state (Q2) to low. This state transition initiates a third interrupt to notify the control unit 21 that a high voltage pulse having negative peak has been started. Then, if the pulse state voltage Vs rises in excess of the reference voltage ((B) in FIGS. 4B and 5B), the comparator 23b changes its output state (Q2) to high. And, the state transition initiates a fourth interrupt to notify the control unit 21 that the high voltage pulse has reached its negative peak.

At this time, since the second comparator 23b is set to the high state as the initial condition, it responses only to the high voltage pulse having negative peak to initiate the third interrupt. The control unit 21 recognizes the occurrence of a high voltage pulse having negative peak, in the third interrupt. In the fourth interrupt, the control unit 21 converts the second divided peak voltage V3 through the second A/D conversion channel 22b into a digital value to measure the negative peak voltage.

As a single measuring sequence is finished by the second or the fourth interrupt, the next valid interrupt will appear after 0.75 to 1.5 seconds that is the high voltage pulse cycle. Therefore, in order to prevent the repeated unnecessary interrupts initiated by the residual vibrations ((C)-(E) in FIGS. 4A, 4B, 5A, and 5B), the interrupts initiated by the comparators 23a and 23b are disabled temporarily for a predetermined period of time (0.1 to 0.2 seconds).

The peak voltage measuring sequences are summarized in the flow charts shown in FIGS. 6A and 6B with brief descriptions. FIG. 6A shows the flow chart of the interrupt service routine (Comparator #1 ISR) program initiated by the first comparator 23a, and FIG. 6B shows the flow chart of the interrupt service routine (Comparator #2 ISR) program initiated by the second comparator 23b.

In the flow charts, the variable nINT represents the interrupt number. If nINT remains 0 (zero), it means the measuring sequence is not started yet, that is, a high voltage pulse has not appeared yet. Also, the variable Pulse_Type is set to POS if the high voltage pulse has a positive peak, or it is set to NEG if the high voltage pulse has a negative peak.

Meanwhile, the measurement sequence of the first embodiment which measures only the high voltage pulse having a positive peak may employ the same sequence that the second and the third embodiments have. That is, the sequence of the first embodiments can be executed by the interrupt service routine program shown in FIG. 6A, if the second D/A converter 24b is set to output 0V. Otherwise, referring to FIG. 2a, the reference of the first comparator 23a can be set in a wide range by the second D/A converter 24b.

The digital value converted via the second or fourth interrupt is transmitted to the display unit 30 from the control unit 21 after converted to have an engineering unit values, such as volts (V) or kilovolts (kV).

The display unit 30 receives the digital value and the start of the high voltage pulse signal provided by the pulse state voltage Vs from the control unit 21, and may indicate them in the form of sound, light, characters, or a combination thereof.

For example, a buzzer (not shown) or an LED (not shown) can be used to make sound or emit light for indicating the occurrence of a high voltage pulse. In addition, it is possible to light a plurality of lamps (not shown) selectively depending on the strength of a measured voltage. Also, the measured voltage can be displayed in the form of characters through a character display unit (not shown).

Meanwhile, in the embodiments of the present disclosure, a micro controller unit of PIC16F1828 or other similar ones may be applied for the MCU 20.

The MCU 20 contains built-in A/D conversion channels, control unit, comparators, and D/A converter. The MCU 20 having this feature is applicable for the construction of the voltmeter according to the present disclosure, because the complexity of the circuit can be significantly simplified.

In addition, the sample and hold capacitance of the A/D conversion channel of the MCU (PIC16F1828) 20 is only 10 pF.

Since the capacitances of the capacitors C2 and C3 having both 1 nF are sufficiently large compared to that of the sample and hold capacitor, it becomes possible to directly input the divided peak voltages V2 and V3 into the A/D conversion channels 22a and 22b of the MCU 20, without going through additional buffers.

According to the specifications described so far, an electric fence voltmeter that improves a measurement accuracy, becomes cost-effective, and draws less power from a battery, can be provided.

While this invention has been described in connection with what is presently considered to be practical exemplary embodiments, it is to be understood that the invention is not limited to the discovered embodiments, but, on the contrary, is intended to cover various modifications and equivalent arrangements.

LIST OF REFERENCE NUMERALS 1 electric fence voltmeter
10 peak detection type voltage divider 11 probe
20 MCU (micro controller unit) 21 control unit
22 A/D (analog to digital) conversion channel 23 comparator
24 D/A (digital to analog) converter 30 display unit
40 power supply unit 41 battery
42 switch
C1 high voltage side voltage dividing capacitor
C2, C3 low voltage side first and second voltage dividing capacitors
C4 coupling capacitor
D1, D2 first and second rectifier diodes
R1, R2 first and second bias resistors
V1 voltage across capacitor C1
V2, V3 first and second divided peak voltages
Vp probe voltage
Vs pulse state voltage
Gnd ground

What is claimed is:

1. An electric fence voltmeter, comprising:
a peak detection type voltage divider, comprising:
a first voltage divider composed of a capacitor (C1) of which the first electrode (C1a) is connected to a probe (11) to which a high voltage pulse is applied, and a capacitor (C2) of which one electrode is connected to a ground (Gnd);
a first rectifier diode (D1) of which the anode is connected to the second electrode (C1b) of the capacitor (C1), and the cathode is connected to the other electrode of the capacitor (C2); and
a second rectifier diode (D2) of which the cathode is connected to the second electrode (C1b) of the capacitor (C1), and the anode is connected to the ground (Gnd),
whereby a first divided peak voltage (V2) is detected across the capacitor (C2), and a pulse state voltage (Vs) is detected at the second electrode (C1b) of the capacitor (C1);
a first A/D conversion channel (22a) for converting the first divided peak voltage (V2) into a digital value;
a display unit (30) for displaying the digital value; and
a control unit (21) for controlling the display unit (30), and reading the peak detection type voltage divider.

2. The electric fence voltmeter of claim 1, further comprising:
a second voltage divider composed of the capacitor (C1) and a capacitor (C3) of which one electrode is connected to the anode of the second diode (D2) and the other electrode is connected to the ground (Gnd), whereby a second divided peak voltage (V3) is detected across the capacitor (C3); and
a second A/D conversion channel (22b) for converting the second divided peak voltage (V3) into a digital value.

3. The electric fence voltmeter of claim 2, further comprising:
a first comparator (23a) and a second comparator (23b) connected between the second electrode (C1b) of the capacitor (C1) and the control unit (21).

4. The electric fence voltmeter of claim 3, wherein the comparators (23a) and (23b) analyze the information contained in the pulse state voltage (Vs) to provide a signal indicating the moments the high voltage pulse starts and peaks to the control unit (21) in an interrupt mode.

5. The electric fence voltmeter of claim 4, wherein the control unit (21) recognizes the polarity and the occurrence of the high voltage pulse via the interrupt initiated at the start of the pulse, and converts the first divided peak voltage (V2) or the second divided peak voltage (V3) into a digital value through the first A/D conversion channel (22a) or the second A/D conversion channel (22b) depending on the polarity of the high voltage pulse via the interrupt initiated at the peak of the pulse.

6. The electric fence voltmeter of claim 2, further comprising:
a first bias resistor (R1) connected to the capacitor (C2) in parallel; and
a second bias resistor (R2) connected to the capacitor (C3) in parallel.

7. The electric fence voltmeter of claim 2, further comprising:
a first bias resistor (R1) connected to the capacitor (C2) in parallel;
a second bias resistor (R2) of which one end is connected to the capacitor (C3);

a first D/A converter (24*a*) of which the output is connected to the other end of the second bias resistor (R2) for supplying the bias voltage (Vb); and a coupling capacitor (C4) connected between the second rectifier diode (D2) and the capacitor (C3) for blocking a current flowing through the second rectifier diode (D2) by the bias voltage (Vb).

8. The electric fence voltmeter of claim 7, wherein the first D/A converter (24*a*) is set to output the bias voltage (Vb) of which the voltage potential is identical to that of the reference voltage (ADC reference voltage) of the A/D conversion channels (22*a*) and (22*b*).

9. The electric fence voltmeter of claim 2, wherein the control unit (21), the A/D conversion channels (22*a*) and (22*b*), and the comparators (23*a*) and (23*b*) are integrated in an MCU (micro controller unit) (20).

10. The electric fence voltmeter of claim 9, wherein the first and the second divided peak voltages (V2) and (V3) detected from the capacitors (C2) and (C3) are directly inputted to the A/D conversion channels (22*a*) and (22*b*) of the MCU (20).

11. The electric fence voltmeter of claim 1, wherein the display unit (30) further displays the start of the high voltage pulse, and the start of the pulse and the digital value are displayed in the form of sound, light, characters, or a combination thereof.

\* \* \* \* \*